(12) United States Patent
Osinski et al.

(10) Patent No.: US 6,593,589 B1
(45) Date of Patent: Jul. 15, 2003

(54) SEMICONDUCTOR NITRIDE STRUCTURES

(75) Inventors: Marek Osinski; Petr Eliseev, both of Albuquerque, NM (US)

(73) Assignee: The University of New Mexico, Albuquerque, NM (US)

( * ) Notice: Subject to any disclaimer, the term of this patent is extended or adjusted under 35 U.S.C. 154(b) by 0 days.

(21) Appl. No.: 09/239,947

(22) Filed: Jan. 29, 1999

Related U.S. Application Data

(60) Provisional application No. 60/073,210, filed on Jan. 30, 1998.

(51) Int. Cl.$^7$ ................. H01L 29/06; H01L 31/0328
(52) U.S. Cl. ................................ 257/22; 257/615
(58) Field of Search ...................... 257/22, 615

(56) References Cited

U.S. PATENT DOCUMENTS

| | | | |
|---|---|---|---|
| 5,481,397 A | | 1/1996 | Burt .................. 359/298 |
| 5,509,025 A | | 4/1996 | Capasso et al. ........... 372/45 |
| 5,539,239 A | | 7/1996 | Kawazu et al. ........... 257/94 |
| 5,570,386 A | | 10/1996 | Capasso et al. ........... 372/46 |
| 5,578,839 A | * | 11/1996 | Nakamura et al. ......... 257/201 |
| 5,831,277 A | * | 11/1998 | Razeghi ................ 257/22 |
| 5,880,491 A | * | 3/1999 | Soref et al. ............. 257/22 |
| 5,959,307 A | * | 9/1999 | Nakamura et al. ......... 257/201 |
| 6,204,084 B1 | * | 3/2001 | Sugiura et al. ........... 257/103 |

OTHER PUBLICATIONS

Belenov et al., "Analysis of optical amplification due to tunneling of electrons in a quantum–well semiconductor heterostructure," *Sov. J. Quantum Electron.* 18 (8), Aug. 1988.

Borenstain et al., "Evaluation of the feasibility of a far–infrared laser based on intersubband transitions in GaAs quantum wells," *Appl. Phys. Lett* 55 (7) Aug. 14, 1989.

Faist et al., "Measurement of the intersubband scattering rate in semiconductor quantum wells by excited state differential absorption spectroscopy," *Appl. Phys. Lett.* 63 (10), Sep. 6, 1993.

Faist et al., "Mid–infrared field–tunable intersubband electroluminescence at room temperature by photon–assisted tunneling in coupled–quantum wells," *Appl. Phys. Lett.* 64 (9) Feb. 28, 1994.

Faist et al., "Narrowing of the intersubband electroluminescent spectrum in coupled–quantum–well heterostructures," *Appl. Phys. Lett.* 65 (1), Jul. 4, 1994.

Faist et al., "Phonon limited intersubband lifetimes and linewidths in a two–dimensional electron gas," *Appl. Phys. Lett.* 64 (7), Feb. 14, 1994.

Faist et al., "Quantum Cascade Laser," *Science*, vol. 264, Apr. 22, 1994.

Faist et al., "Quantum cascade laser: Temperature dependence of the performance characteristics and high $T_0$ operation," *Appl. Phys. Lett* 65 (23) Dec. 5, 1994.

Faist et al., "Continuous wave operation of a vertical transition quantum cascade laser above T=80 K," *Appl. Phys. Lett.* 67 (21), Nov. 20, 1995.

Faist et al., "Quantum Cascade Lasers without Intersubband Population Inversion," *Physical Review Letters*, vol. 76, No. 3, Jan. 15, 1996.

Faist et al., "Room temperature mid–infrared quantum cascade lasers," *IEE, Electronics Letters Online No. 19960395*, Jan. 28, 1996.

(List continued on next page.)

*Primary Examiner*—Stephen D. Meier
(74) *Attorney, Agent, or Firm*—Jagtiani & Guttag

(57) ABSTRACT

The present invention provides a unipolar semiconductor structure comprising: at least one active layer comprising at least one group III-nitride; and at two barrier layers disposed on either side of the active layer, each of the two barrier layers comprising at least one group

21 Claims, 4 Drawing Sheets

OTHER PUBLICATIONS

Ferreira et al., "Evaluation of some scattering times for electrons in unbiased and biased single–and multiple–quantum–well structures," *Physical Review B*, vol. 40, No. 2, Jul. 15, 1989.

Gelmont et al., "Theory of the spectral line shape and gain in quantum wells with intersubband transitions," *Appl. Phys. Lett.* 68 (16), Apr. 15, 1996.

Helm et al., "Observation of grating–induced intersubband emission from GaAs/AlGaAs superlattices," *Appl. Phys. Lett.* 53 (18), Oct. 31, 1988.

Hu et al., "Feasibility of far–infrared lasers using multiple semiconductor quantum wells," *Appl. Phys. Lett.* 59 (23), Dec. 2, 1991.

Kastalsky et al., "Possibility of infrared laser in a resonant tunneling structure," *Appl. Phys. Lett.* 59 (21), Nov. 18, 1991.

Kazarinov et al., "Possibility of the Amplification of Electromagnetic Waves in a Semiconductor with a Superlattice," *Soviet Physics–Semiconductor*, vol. 5., No. 4, Oct., 1971.

Levine et al., "New 10 $\mu$m infrared detector using intersubband absorption in resonant tunneling GaAlAs superlattices," *Appl. Phys. Lett.* vol. 50, No. 16, Apr. 20, 1997.

Pankove, J. I., "Optical processes in Semiconductors," *Prentice–Hall Engewood Cliffs*, NJ (1971).

West et al., "First observation of an extremely large–dipole infrared transition within the conduction band of a GaAs quantum well," *Appl. Phys. Lett.* 46 (12), Jun. 15, 1985.

West et al., "Quantum well mid–infrared lasers based on above–barrier transitions," *132/SPIE* vol. 2145.

Yang et al., "Population inversion through resonant interband tunneling," *Appl. Phys. Lett.* 59 (2), Jul. 8, 1991.

\* cited by examiner

SEMICONDUCTOR NITRIDE STRUCTURES

This application claims the benefit of U.S. provisonal application No. 60/073,210, filed Jan. 30, 1998.

BACKGROUND OF THE INVENTION

1. Field of the Invention

The present invention relates to semiconductor optoelectronics including devices for photodetection, optical modulation and switching, emission of non-coherent or coherent radiation.

2. Description of the Prior Art

In semiconductor structures, the tunneling of electrons across a potential barrier may be accompanied by the emission of optical (both visible and IR) radiation. In particular, tunneling through the barrier in the p-n junction may result in emission of photons with an photon energy controlled by the junction voltage (so called "diagonal tunneling"). An interesting feature of the emission is the feasibility of tuning the wavelength by application of a voltage. Progress in fabrication of quantum wells is opening new opportunities for the use of tunneling in optoelectronic devices, both for radiation sources, such as lasers, and detectors.

In R. F. Kazarinov and R. A, Suris, "Possibility of the amplification of electromagnetic waves in a semiconductor with a superlattice," Sov. Phys. Semicond, 5 (10), 207–209, (1971, October), the optical amplification in the IR region is suggested by transitions between electronic minibands in semiconductor superlattice. Different other versions for unipolar laser operation are proposed in following papers: E. M. Belenov, P. G. Eliseev, A. N. Oraevskii, V. I. Romanenko, A. G. Sobolev, and A. V. Uskov, "Analysis of optical amplification due to tunneling of electrons in a quantum-well semiconductor structure", Sov. J Quant. Electronl, 18 (8), 995–999 (1988, August). R. Q. Uang and J. M. Zu, "Population inversion through resonant interband tunneling", AppL. Phys. Lett., 59, 181–182 (1991, July 8). A. Katalsky, V. J. Goldman, and J. H. Abeles" "Possibility of infrared lasaer in a resonant tunneling structure", Appl. Phys. Lett., 59 (21), 2636–2638 (Nov. 18, 1991). Q. Hu and S. Feng, "Feasibility of far-infrared lasers using multiple semiconductor quantum wells", Appl. Phys. Lett., 59, 2923–2925 (Dec. 2, 1991). S. I. Borenstain and J. Katz, "Evaluation of the feasibility of a far-infrared laser based on intersubband transitions in quantum wells", AppL. S Phys. Lett., 55, 654–656 (Aug. 14, 1992). Other structures are proposed to provide the amplification by intraband (intersubband) transitions of electrons in quantum-well structures. In E. M. Belenov, P. G. Eliseev, A. N. Oraevskii, V. I. Romanenko, A. G. Sobolev, and A. V. Uskov, "Analysis of optical amplification due to tunneling of electrons in a quantum-well semiconductor structure", Sov. J Quant. Electronl, 18 (8), 995–999 (August, 1988) resonant tunneling was considered in a quantum well with initial and final states in continuous spectrum. It was proposed also to employ a series (cascade) of such single-step structures to increase the effective optical gain of electromagnetic wave passing through the cascade structure. It was shown that under some bias condition the optical gain of 100 $cm^{-1}$ can be obtained with a spectral peak tunable by the bias voltage. These results are claimed to be applicable to the emission sources (electroluminescent and laser diodes), photodetectors (wavelength-tunable selective photodetection) and optical modulators. Simplified energy band diagram of quantum-well tunnel heterostructure is discussed in E. M. Belenov, P. G. Eliseev, A. N. Oraevskii, V. I. Romanenko, A. G. Sobolev, and A. V. Uskov, "Analysis of optical amplification due to tunneling of electrons in a quantum-well semiconductor structure", Sov. J Quant. Electron., 18 (8), 995–999 (August, 1988).

In A. Kastalsky, V. J. Goldman, and J. H. Abeles, "Possibility of infrared laser in a resonant tunneling structure", AppL. Phys. Lett., 59 (21), 2636–2638 (Nov. 18, 1991), a theoretical analysis was reported of a cascadable quantum-well tunnel structure and the magnitude of the gain of 50–90 $cm^{-1}$ was claimed in the photon energy range near 0.12 eV (wavelength—10 $\mu$m). The three-barrier scheme was assumed as a multi-layer period of the structure with quantum-wells separated by bulk regions.

Unipolar laser action was achieved in and reported by J. Faist, F. Capasso, D. L. Slvco, C. Sirtori, A. L. Hutchinson, and A. Y. Cho, "Quantum cascade laser", Science, v. 264, pp. 553–556 (Apr. 22, 1994). The heterostructure based on InGaAs/AlInGaAs heterosystem were proposed for laser operation at 10.6 $\mu$m with InP cladding layers and InP substrate. A basic structure included many periods of quantum-wells with a total thickness of 4 $\mu$m. In this case, the calculated optical confinement parameter relative the combined active region was estimated as 0.78 and laser oscillation threshold gain obtainable in a 1 mm long diode was estimated as 22 $cm^{-1}$. The calculated efficiency of the proposed laser was stated as 1.3%. The key feature of the proposed structure was identified as the fact that electrons tunnel from the lower level of the active region faster than electron-phonon relaxation time which controls electron population of the upper level. Thus the resonant tunneling is proposed to work for emptying the final state of laser optical transition.

Experimental studies of miniband-transition absorption and quantum-well intersubband absorption were reported in L. C. West and S. I. Eglash, "First observation of an extremely large dipole transition within the conduction band of a GaAs quantum well", AppL. Phys. Lett., 46, 1156–1158 (Jun. 15, 1985). B. F. Levine, K. K. Choi, C. G. Bethea, J. Walker, and R. J. Malik, "New 10 $\mu$m infrared detector using intersubband absorption in resonant tunneling GaAlAs superlattices", Appl. Phys. Lett., 50, 1092–1094, (Apr. 20, 1987). J. Faist, F. Capasso, C. Sirtori, D. L. Sivco, A. L. Hutchinson, S. N. G. Chu, and A. Y. Cho, "Measurement of the intersubband scattering rate in semiconductor quantum wells by excited state differential absorption spectroscopy", Appl. Phys. Lett., 63 (10), 1354–1356 (Sept. 6, 1993) J. Faist, C. Sirtori, F. Capasso, L. Pfeiffer, and K. W. West, "Phonon limited intersubband lifetimes and linewidths in a two-dimensional electron gas", Appl. Phys. Lett., 64 (7), 872–874 (Feb. 14, 1994)] and in a number of other papers, whereas opposite optical processes photon emission and gain were observed later by [M. Helm, E. Colas, P. England, F. DeRosa, and S. J. Allen, Jr., "Observation of grating induced intersubband emission from GaAs/AlGaAs superlattices". Appl. Phpys. Lett., 53, 1714–1716 (Oct. 3, 1998). J. Faist, F. Capasso, C. Sirtori, D. L. Sivco, A. L. Hutchinson, S. N. G. Chu, and A. Y. Cho, "Mid-infrared field-tunable intersubband electroluminescence at room temperature by photon-assisted tunneling in coupled.quantum wells", Appl. Phys. Lett., 64 (9), 1144–1146 (Feb. 28, 1994). J. Faist, F. Capasso, C. Sirtori, D. L, Sivco, A. L. Hutchinson, S. N. G. Chu, and A. Y. Cho, 'Narrowing of the intersubband electroluminescent spectrum in coupled-quantum-well heterostructures", Appl. Phys. Lett., 65 (1), 94–96 (May 3, 1994). J. Faist, F. Capasso, D. L. Slvco, C. Sirtori, A. L. Hutchinson, and A. Y. Cho, "Quantum cascade laser", Science, v. 264, pp. 553–556 (Apr. 22, 1994)]. Most of mid-IR laser realizations of quantum-cascade tunneling lasers are associated with heterosystem InGaAs/AlInGaAs on the InP substrates [J. Faist, F. Capasso, D. L. Sivco, C. Sirtori, A. L. Hutchinson, and A. Y. Cho, "Quantum cascade laser", Science, v. 264, pp. 553–556 (Apr. 22, 1994). J. Faist, F. Capasso, D. L. Sivco, A. L. Hutchinson, C. Sirtori, S. N. G. Chu, and A. Y. Cho, "Quantum cascade laser: Temperature dependence of the performance characateristics and high To operation", Appl. Phys. Lett., 65, 2901–2903 (1994). J. Faist, F. Capasso, C. Sirtori, D. L. Sivco, A. L. Hutchinson, and A. Y. Cho, "Continuous wave operation of a vertical transition quantum cascade laser above T=80K, Appl. Phys. Lett., 67 (21), pp. 3057–3069 (Nov. 20, 1995), J. Faist, F. Capasso, C. Sirtori, D. L. Sivco, A. L. Hutchinson, M. S. Hybersten, and A. Y. Cho, 'Quantum cascade laser without intersubband population inversion," Phys. Rev. Lett., 76,411–414 (1996).

However, despite the work that has been done so far, there continues to be a need to provide unipolar optoelectronic nano-structure devices which have precisely enforced geometrical properties such as uniformity in sizes of the nano-technological objects in the devices, high accuracy in spatial shaping and distance positioning of the objects, providing of proper composition variations etc.

SUMMARY OF THE INVENTION

It is therefore an object of the present invention to provide a family of unipolar optoelectronic nano-structures: lasers, radiation-emitting (non-coherent) diodes, optical modulators, switches and optical non-linear components, photodetectors in new wavelength ranges, for nitride materials. The nitride-based nano-structures of the present invention can be as complicated as a multi-layer, including quantum wells and/or quantum dots, devices with precisely enforced geometrical properties such as uniformity in sizes of the nano-technological objects, high accuracy in spatial shaping and distance positioning if the objects, providing of proper composition variations etc.

According to one aspect of the present invention, there is provided a unipolar semiconductor structure comprising: at least one active layer comprising at least one group III-nitride; and at two barrier layers disposed on either side of the active layer, each of the two barrier layers comprising at least one group III-nitride.

BRIEF DESCRIPTION OF THE DRAWINGS

The invention will be described in conjunction with the accompanying drawings, in which.

DETAILED DESCRIPTION OF THE PREFERRED EMBODIMENT

Definitions

Figure 1:
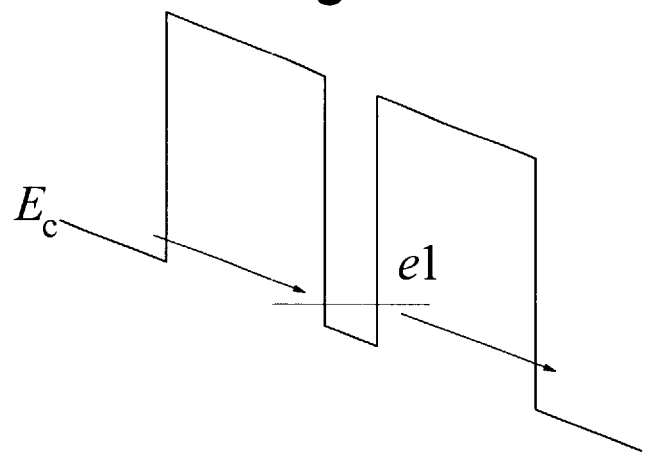
FIG. 1 is an energy diagram of unipolar nitride-based tunneling structures for a two-barrier unipolar structure with diagonal transitions.

For the purposes of the present invention, the term "group III element" includes B, Al, Ga and In.

For the purposes of the present invention, the term "group-III nitride" includes BN AlN, GaN and InN and nitride compounds including of B, Al, Ga and In such as BN, AlN, GaN, InN and their solid solutions (alloys) of following chemical compositions: AlBN, GaBN, InBN, AlGaN, InGaN, AlBGaN, AlGaInN, AlBInN, GaBInN, AlBGaInN, etc. For the purposes of the present invention, the term "alloys of compounds of group-III nitrides" refers compounds including N, at least one of Al, Ga, and In, and a group-V element such as a As or P. Examples of ternary and multinary alloys of compounds of group-III nitrides include AlNAs, AlNP, GaNAs, GaNP, InNAs, InP, AlGaNAs, AlInNAs, GaInNAs, AlGaNAs, AlGaNP, AlInNP, GaInNP, AlGaInNP, ect.

For the purposes of the present invention, the term "atomically balanced group III-nitride materials" refers to materials in which the total number of group III element atoms is substantially the same as the number of nitride atoms. An example of an atomically balanced group III-nitride material is $Al_xGa_{1-x}N$, where x is a number between 0 and 1. For the purposes of the present invention, the term "group III-nitride materials" generally refers to atomically balanced group III-nitride materials unless a group III-nitride material it is specifically indicated that a group III-nitride material is not atomically balanced. For example, the abbreviated chemical formula "AlGaN" generally refers to the composition "$Al_xGa_{1-x}N$, where x is a number between 0 and 1".

For the purposes of the present invention, the term "subband" refers to a plurality of quantum-confined states in nano-structures which are characterized by the same main quantum number. In a conventional quantum-well, the subband is formed by each sort of confined carriers by variation the momentum for motion in unconfined direction with no change of the quantum number describing the motion in the confined direction. Certainly, all states within the subband belong to one of energy band of the solid: conduction band or valence band.

For the purposes of the present invention, the term "nano-structure" refers to semiconductor (solid-state) electronic structures including objects with characteristic size of the nanometer ($10^{-9}$ m) scale. This scale is convenient to deal with quantum wells, wires and dots containing many real atoms or atomic planes inside, but being still in the size range that should be treated in terms of the quantum mechanics.

For the purposes of the present invention term "unipolar device" refers to devices having layers of the same conductivity type, and, therefore, devices in which there are no p-n junctions as necessary component. The term "Unipolar transitions" is used to refer, correspondingly, to electron transitions where there is no change of the charge carrier type. Therefore, the unipolar optical absorption occurs with transition of electron (or hole) between different states in the same energy band (rather between subband, miniband or other quantum-confined states that belong to the same energy band (conduction band or valence band). "Unipolar optoelectronics" is used for the technology and science field related to unipolar devices utilized in optoelectronics.

For the purposes of the present invention the terms "active layer", "active material", "barrier layer" and "barrier material" are relative terms. With respect to two materials within a structure of the present invention, the material with the wider bandgap is considered to be a "barrier material" and the material with the narrower bandgap is considered to be an "active material." Similarly, with respect to two layers within a structure of the present invention, the layer with the wider bandgap is considered to be a "barrier layer" and the layer with the narrower bandgap is considered to be an "active layer." As a result, the energy position of the band edge (as shown in the energy diagrams in FIGS. 1, 2 and 3) is higher in barrier materials/layers and lower in active materials/layers. By this difference in energy positions, a potential well, usually called a "quantum well", is formed.

For the purposes of the present invention, the term "quantum-cascade lasers" (QCLs) refers to such devices as they have conventionally been described in the literature on the unipolar semiconductor lasers.

Description

The present invention provides n-type and p-type unipolar semiconductor structures comprising a semiconductor III-group nitrides as an active material and as a barrier material. These unipolar semiconductor structures can be used in optoelectronic devices all operating with usage of the unipolar optical transitions such as intersubband transitions in quantum-size structures, tunneling-assisted vertical and diagonal transitions with resonant and non-resonant tunneling between structural components.

In the semiconductor structure of the present invention, group III-nitride band gap adjustment material is added to one group III-nitride material layer to increase or decrease the band gap of the group III-nitride material layer, thereby causing the group III-nitride material layer to act as a barrier layer or an active layer with respect to a second group III-nitride material layer. For example, adding AlN to a GaN layer increases the band gap of the GaN layer. Therefore, the resulting AlGaN layer can be a barrier layer for a GaN active layer. Conversely, adding InN to a GaN layer decreases (narrows) the band gap of the GaN layer. Therefore the resulting InGaN can be an active material between two GaN barrier layers. By adjusting the bandgap of at least one of the group III-nitride layers, structures can be formed that are similar to conventional bipolar laser structures. Although only a relatively simple case is described, it is also possible to add a group III-nitride bandgap adjustment material to three layers of a semiconductor structure to produce a barrier layer-active layer-barrier layer sandwhich.

The unipolar semiconductor structures of the present invention can be used to make selective semiconductor nitride-based photodetectors in wide spectral range including quantum-well infra-red photodetectors (QWIPs), quantum-well visible-light and ultra-violet photodetectors and unipolar photodetecting structures with quantum dots and/or quantum wires.

The unipolar semiconductor structures of the present invention can be used to make nitride-based unipolar emitters for non-coherent radiation at selective wavelengths in wide spectral range including infra-red, visible and ultra-violet ranges with quantum wells, quantum dots and/or quantum wires.

The unipolar semiconductor structures of the present invention can be used to make ultra-high-speed nitride-based unipolar optical modulators and switches for selected wavelengths in wide spectral range including infra-red, visible and ultra-violet ranges with quantum wells, quantum dots and/or quantum wires.

The unipolar semiconductor structures of the present invention can be used to make nitride-based unipolar lasers emitting coherent radiation at selective wavelengths in wide spectral range including infra-red, visible and ultra-violet ranges with quantum wells, quantum dots and/or quantum wires.

The unipolar semiconductor structures of the present invention can be used to make nitride-based unipolar photoreceivers with quantum-dots as optical absorbers with an excitation of the working carriers into continuum (where the working carriers are free carriers available for translation motion of the charged particles in the applied electrical field).

Figure 2:
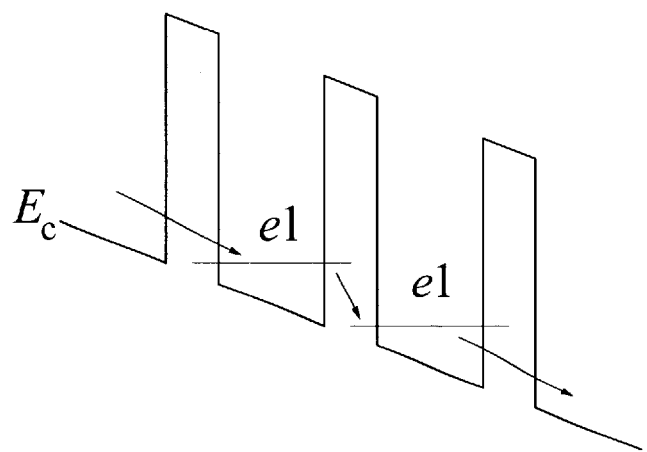
FIG. 2 is an energy diagram of unipolar nitride-based tunneling structures for a three-barrier unipolar structure with diagonal transitions.

FIG. 1 shows a simplified energy band diagram for a quantum-well tunnel heterostructure including two barriers. FIG. 2 shows a simplified energy band diagram for a quantum-well heterostructure including three barriers with diagonal (inter-well) tunneling and with a spectrum of the gain peaking at 5.2 $\mu$m. The well thickness was assumed to be 4–5 nm and operation current is 30 kA/cm$^2$ at 300 K. Such a three-barrier structure was claimed to be capable of much stronger optical amplification (above $10^3$ cm$^{-1}$) than a two-barrier structure shown in FIG. 1. This demonstrates that the optical gain may exhibit resonances at frequencies corresponding to the transitions involving quasi-levels (levels of coupled quantum-confined states) in quantum-wells separated by tunneling-penetrable barrier. These resonances are due to the resonant tunneling accompanied by the emission or absorption of electromagnetic radiation photons. Thus, the resonant enhancement of the tunneling accompanied by the optical transitions makes it possible to amplify emission, and peak of the gain-spectrum may be modified by applied voltage.

Preferably, the synthesis of materials for the present invention, including group III nitrides and nano-structures are formed using metalorganic chemical vapor deposition (MOCVD) epitaxial technology and/or molecular beam technology with a variety of heterogeneous substrates such as: sapphire, silicon, silicon carbide, etc. The material preparation includes mono-molecular-step growing of layered (multi-layer) and lower-dimensionality (quasi-molecule) structures. The processing phase includes application of advanced technological tools to a creation of new optoelectronic devices (with a proper development of processing means applicable to the mechanically hard and chemically inert nitride crystals (for example, dry reactive etching, selective light-assisted growth and etching, ion-beam assisted mask preparation etc The present invention provides a family of unipolar optoelectronic nano-structures: lasers, radiation-emitting (non-coherent) diodes, optical modulators, switches and optical non-linear components, photodetectors in new wavelength ranges (for nitride materials). The nitride-based nano-structures of the present invention can be as complicated as a multi-layer, including quantum wells and/or quantum dots, devices with precisely enforced geometrical properties such as uniformity in sizes of the nano-technological objects, high accuracy in spatial shaping and distance positioning if the objects, providing of proper composition variations etc.

Nano-structures are an example of artificial supermolecules constructed by proper combination of crystalline materials at a nanometer scale. The molecular (or atomic) analog is valid because the fundamental properties of the nano-structures can be understood only in term of quantum physics as secondarily applied to the objects. Quantum-mechanical equations were first used to understand the energy-band diagram of uniform crystalline solids, but have now also be used to describe physical properties of nano-structures. Use of terms of the quantum theory of the solids is made. In principle, the artificial nature of the nano-structures allows to transform the ordinary quantum-mechanical problem from those explaining features of electronic system in the Coulomb field to new quantum mechanical problem of optimization of the field profile and symmetry, for optimization of the nano-structure operation.

The creation of optimized objects, such as quantum wells and quantum dots, and the regular arrangement of several of these objects allows for the creation of desirable physical properties on a nano-structure, such as optimal usage of the pumping mechanism, proper limitation of spontaneous and noise processes, proper directionality and selectivity of the interaction with an electromagnetic radiation). Advanced nano-structures of the present invention are produced using device designs described herein and semiconductor nitrides as the base material. The approach provides a general design for device manufacture, which production can be accelerated by using semiconductor nitrides as a perspective material system in the realization of very new advanced nano-structures.

Figure 3:
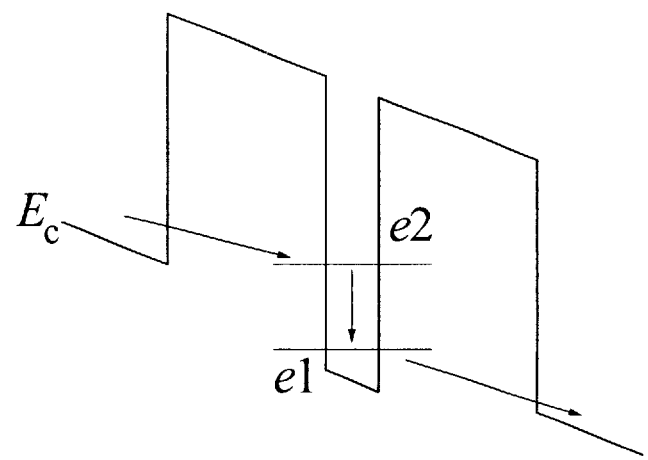
FIG. 3 is an energy diagram of unipolar nitride-based tunneling structures for a two-barrier unipolar structure with vertical transitions.

FIGS. 1, 2 and 3 are energy diagrams of unipolar nitride-based tunneling structures on an example of n-type structure. The barrier layers are of wide bandgap nitride and the well layers are of narrow bandgap nitride. For example, in one embodiment of the present invention AlGaN can be used for barriers and GaN for wells. In another embodiment of the present invention, GaN can be used for barriers and InGaN for wells. $E_c$ is the conduction band edge, e1 and e2 are quantum-confined states in the wells. FIG. 1 shows an energy diagram of a two-barrier unipolar structure with the diagonal transitions, FIG. 2 shows an energy diagram for a three-barrier unipolar structure with the diagonal transitions, and FIG. 3 shows an energy diagram for a two-barrier structure with a vertical transition.

Figure 4:
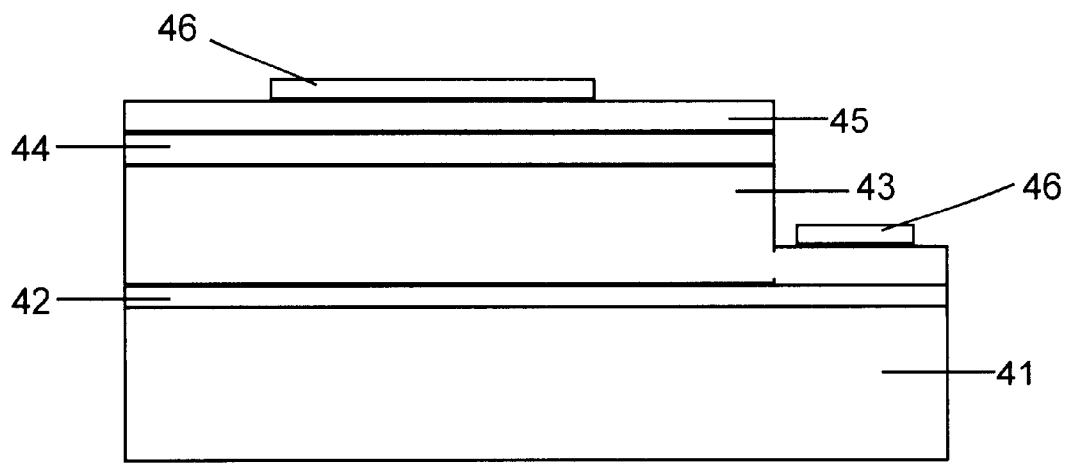
FIG. 4 illustrates a unipolar nitride device of the present invention on a non-conductive substrate.

FIG. 4 illustrates a unipolar nitride device of the present invention on non-conductive substrate such as sapphire, spinel, zinc oxide, etc. In FIG. 4, a substrate 41 has deposited thereon a nitride buffer layer 42. On top of the nitride buffer layer 42, there is deposited a nitride ground layer 43. On top of the nitride ground layer 43, there is deposited a nitride active region layer 44. On top of the nitride active region 44, there is deposited a bulk nitride barrier layer 45. Electrodes 46 are deposited on the nitride ground layer 43 and the bulk nitride barrier layer 45 as shown.

Figure 5:
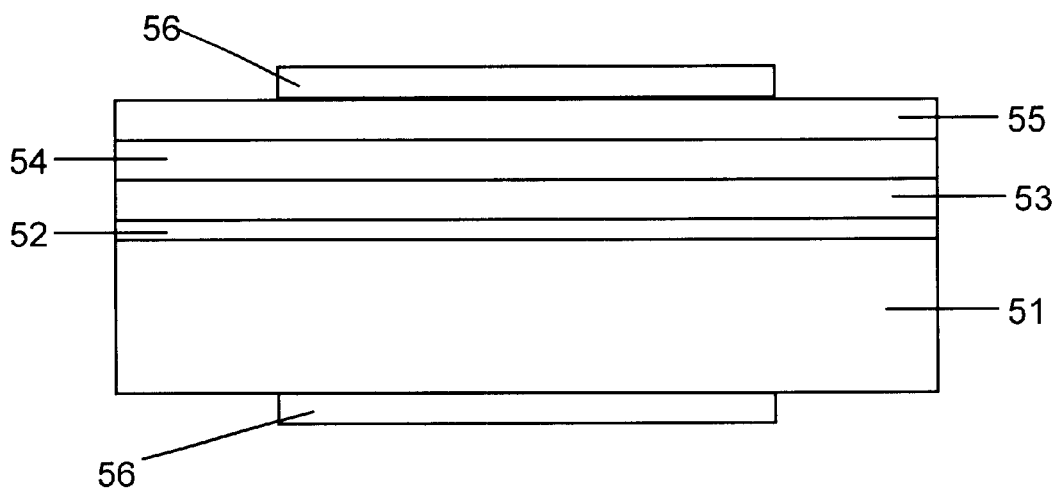
FIG. 5 illustrates a unipolar nitride device of the present invention on a conductive substrate.

FIG. 5 illustrates a unipolar nitride device of the present invention on conductive substrate such as silicon, silicon carbide, gallium arsenide, etc. In FIG. 5, a substrate 51 has deposited thereon a nitride buffer layer 52. On top of the nitride buffer layer 52, there is deposited a nitride ground layer 53. On top of the nitride ground layer 53, there is deposited a nitride active region layer 54. On top of the nitride active region 54, there is deposited a bulk nitride barrier layer 55. Electrodes 56 are deposited on the substrate 51 and bulk nitride barrier layer 55 as shown.

In the embodiments of the semiconductor structure or device of the present invention shown in FIGS. 4 and 5 the substrate can be a single crystal material. Typical substrate materials which can be used can be non-conductive, such are sapphire or conductive, such as doped silicon carbide. However, semiconductor materials such as Si, GaAs, GaN, etc. can also be used. The substrate layer gives support for crystalline growth of nitride layers deposited or grown on top of the substrate and can compose most of the volume of the devices shown in FIGS. 4 and 5. When the substrate is non-conductive, the electrodes are preferably made on one side of the substrate as shown in FIG. 4. When the substrate is conductive, the electrodes are preferably placed on opposite sides of the substrate as shown in FIG. 5.

In the embodiments of the semiconductor structure or device of the present invention shown in FIGS. 4 and 5, the buffer layers are made from semiconductor nitride materials which function to relax the lattice misfit between the substrate and other nitride layers. Such buffer layers are conventionally used in almost all commercial nitride-based devices.

In the embodiments of the semiconductor structure or device of the present invention shown in FIGS. 4 and 5, the barrier layers conduct current to and from the active region layers and provide and provide potential barriers for quantum-confined states in the active region.

In the embodiments of the semiconductor structure or device of the present invention shown in FIGS. 4 and 5, the active region layers each consist of one or more layers containing quantum well or dot layer(s) and internal barrier layers having properties in accordance with the energy diagrams shown in FIGS. 1, 2, and 3. The active regions can contain layers with quantum-confined states for working. Unipolar transitions between these quantum confined states can supply the operation mechanisms of unipolar optoelectronic devices.

Figure 6:
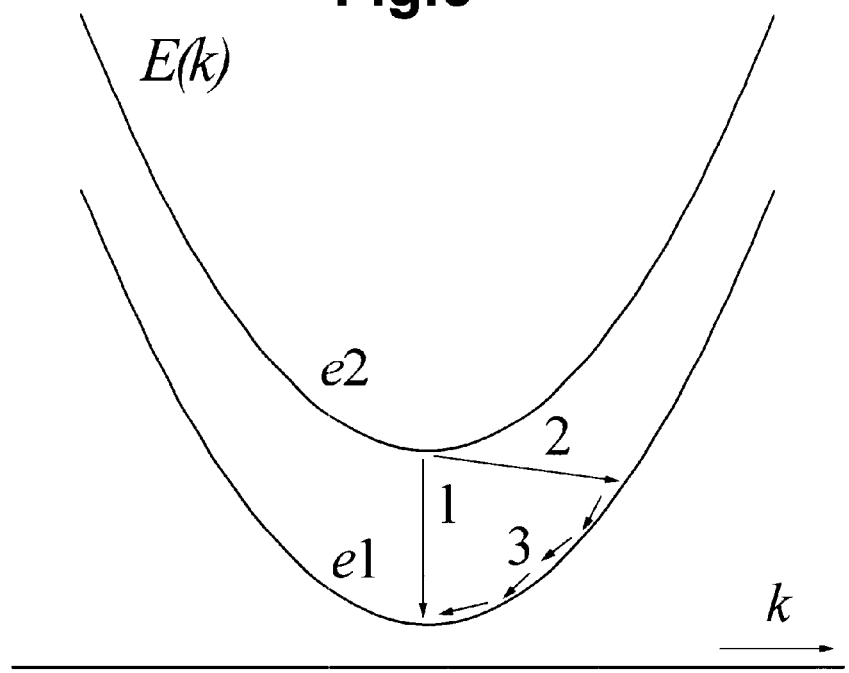
FIG. 6 is an energy diagram of unipolar nitride-based photoreceiver of the present invention.

FIG. 6 is an energy diagram of a unipolar nirtide-based photoreceiver of the present invention having an n-type structure. For example, the photoreceiver can have AlGaN barriers, and GaN wells; or GaN barriers and InGaN wells. In FIG. 6, $E_c$ is the conduction band edge and e1 and e2 are quantum-confined states in the wells.

Figure 7:
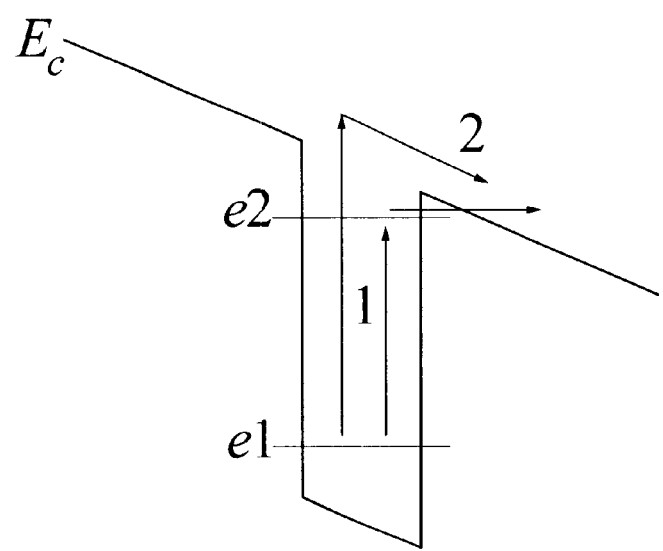
FIG. 7 illustrates the types of transitions between excited and ground subbands in a quantum well conductive region.
Figure 8:
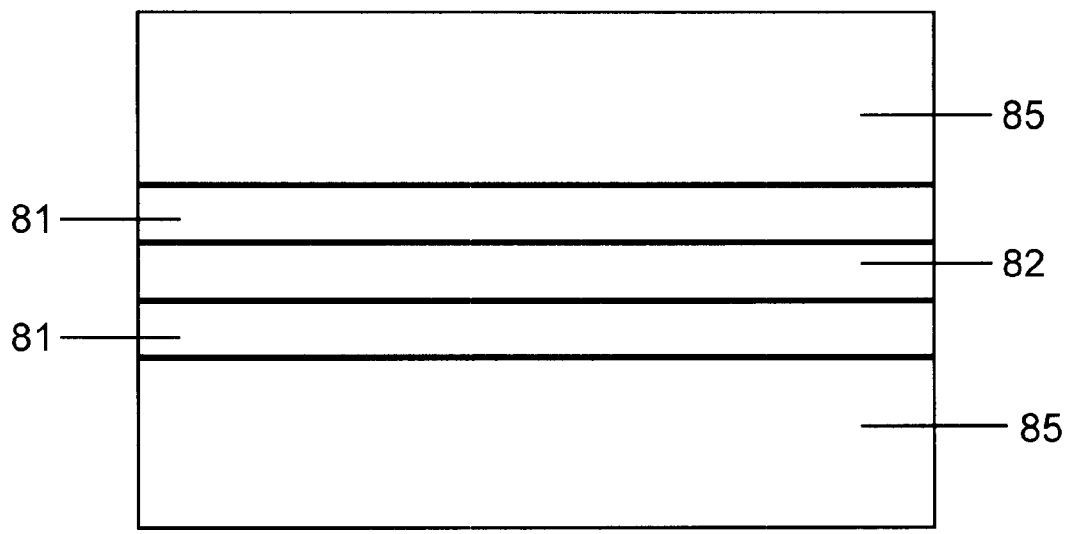
FIG. 8 illustrates an active region of a unipolar nitride-based optoelectronic device of the present invention for a layered quantum-well two-barrier structure.

FIG. 7 illustrates the types of transitions between excited (e2) and ground (e1) subbands in the quantum-well active region: In FIG. 7, arrow 71 represents an optical inter-subband emission transition and arrow 72 represents a non-radiative phonon-assisted inter-subband transition (inter-subband relaxation), FIG. 8 represents an embodiment of an active region of a unipolar nitride-based optoelectronic device of the present invention having a layer structure comprising a quantum well and two barriers. In FIG. 8, two wide bandgap nitride barriers 81 are located on either side of a well 82 of a narrow bandgap nitride. Respective bulk material nitride layers 85 are located on the outside of respective nitride barriers 81.

Figure 9:
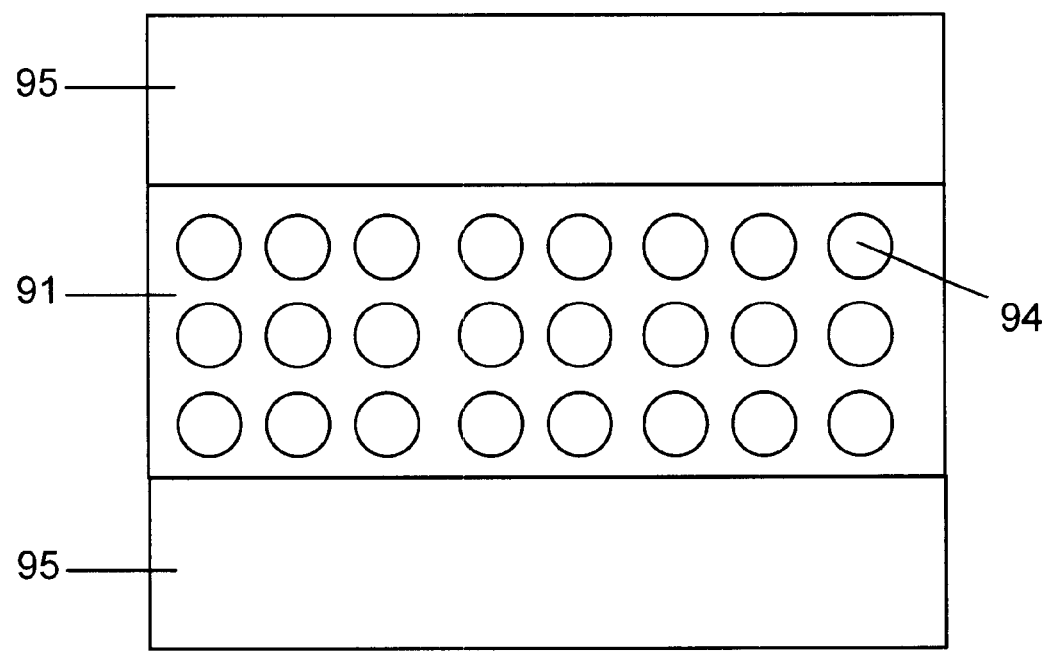
FIG. 9 illustrates an active region of a unipolar nitride-based optoelectronic device of the present invention for a layered quantum-dot two-barrier structure.

FIG. 9 represents an embodiment of an active region of a unipolar nitride-based optoelectronic device of the present invention having a quantum-dot structure. In FIG. 9 rows of quantum dots 94 made from a narrow bandgap nitride are formed in a matrix 91 made from a wide bandgap nitride. On either side of the matrix 91 there is a bulk material layer 95 made from a nitride material.

In contrast to more traditional material systems such as GaAs-AlAs and InP-AlGaInAs), the nitride material systems of the present invention, such as AlN-GaN-InN allow a significantly wider range of the potential barrier height, approximately 4 eV as compared with 0.4–0 5 eV in more conventional material systems. This means that there is much more range for unipolar electronic confinement. The confinement is the tool for localization and proper limitation of the movement of electrons, which appear to be controlled for desirable sorts of interaction with photons. A theoretical consideration relates to the nano-technology 1-D objects with quantum-size dimension and capturing a single electron. Such an electron has an effective mass that is much smaller than that of an electron in free space. For example, in GaN the effective electron mass is about 5 times less than electronic residual mass. The object is supplied with proper profile of the potential energy by the spatial variation of the material composition, from AlN to GaN, as an example, and can have a rectangular well profile.

Important issues of the application of the nitride-based nano-structures in the unipolar optoelectronics are associated with (i) crystalline quality, (ii) very fast intraband non-radiative relaxation, (iii) strong spectral broadening as observed in bipolar nitride-based structures.

Crystalline quality of typical nitride epilayers and epistructures is very poor due to usage of heterogeneous (lattice-mismatched) substrates since bulk substrates of nitrides are not easily available. The dislocation density of $10^9$–$10^{11}$ cm$^{-2}$ has been found in commercially produced GaN/InGaN LED wafers grown on the sapphire substrates. This is an unprecedented high structural defect content for any other semiconductor optoelectronic devices. There is certain progress in the improvement of the crystalline quality of nitride epilayers until the lattice-misfit substrates are used. A recent achievement has been the growing of nitride platelets which can be used as a substrate for nitride homoepitaxy. In the case of the homoepitaxy, the main factor of the defect formation, namely the large lattice misfit between substrate and epilayers, is eliminated. The content of dislocations and other extended defects, such as stacking faults and inversion domains will be reduced to that level defined by the crystalline quality of the substrate. This will allow a preparation and utilization of nitride-based nano-structures of the high crystalline quality as in conventional semiconductor optoelectronics.

Intraband relaxation in GaN, as well as in related nitrides, is very fast due to both a strong electron-phonon coupling and high defect content in the material The interaction of electrons with phonons, presumably, with LO-phonon, supplies fast inter-subband relaxation which can quench the radiative unipolar processes. This factor of basic nature provides a possibility of the high-speed operation of nitride-based optical modulators and photoreceivers. However it is a serious obstacle for efficient unipolar luminescence and for unipolar laser action. An intersubband single-LO-phonon relaxation process is rather easy in 2-D system, where the dispersion curves for quantum-confined states is similar in upper and lower levels. In order to modify the rate of the electron-phonon scattering, the lower-dimensionality structure are proposed (having different dispersion curves). In the 0-D case (of the quantum dots), the discrete level system is operating canceling easy single-phonon relaxation. The multi-phonon relaxation process has a much lower rate. By this way the control of the non-radiative process could be achieved with an increase of the radiative quantum yield and with lower threshold current for the unipolar laser oscillations.

The spectral broadening has been found to be rather strong in the inter-band luminescence from GaN and InGaN based structures. The main origins of this are scattering at numerous defects, inhomogeneous broadening, and very fast intra-subband relaxation homogeneous broadening. Probably, the inhomogeneous factor is controllable by the crystalline quality of the material. In addition to this, an apparent correlation exists between the spectral bandwidth and indium content in the InGaN quantum wells. This indicates the possibility to optimize the chemical and crystalline-defect content in the active region for reducing the inhomogeneous broadening. In the case of quantum dot nano-structures, the main challenging factor will be the inhomogeneous broadening associated with the scattering of the dots in their size (by an analogue with QD structures based on InGaAs technology).

In spite the large spectral broadening, the inter-band (bipolar) laser action has been achieved in nitride-based nano-structures of the multiple-quantum-well (MQW) type. The considerations concerning the advantages and disadvantages of the wide-bandgap nitride-based unipolar nano-structures against more traditional InGaAs-based ones are given below.

Theoretical aspects of the unipolar optical transitions are not yet developed comprehensively. There are numerous issues relating to the performance of the devices of the unipolar optoelectronics. Early theoretical results appeared to be successful in prediction of basic features of actual unipolar lasers, quantum-cascade lasers, based in InGaAs technology. For new application of nitride-based nano-structures in the unipolar optoelectronics, more detailed theory is need as well as the development of the material aspect of the unipolar optoelectronic devices.

Most basic problems relating to the energy diagram and transition rate in the unipolar structures can be treated on the base of the Schroedinger equation for the two-level system, interacting with an electromagnetic wave at the optical frequency $\nu$.

Studies of electrical properties of the nitride-based structures indicate the tunneling as a predominating mechanism of transport through the heterojunction barriers. A first evidence of the tunneling is I–V curves having the semilog slope which is not temperature dependent. This has been reported for GaN-based double-heterojunction structure. Also, in SQW high-efficiency LEDs of AlGaN/InGaN/GaN type the tunneling is shown to dominate at both reverse and forward bias up to about 100 A/cm$^2$, or more. It seems the tunneling is a regular pumping mechanism in nitride based interband LEDs under forward bias. The radiative, photon-assisted, tunneling of holes occurs, probably from p-side AlGaN of the junction into quantum-confined states in the ultrathin active region of InGaN There are also nonradiative tunneling processes identified at lower current density at both polarity of the junction bias.

Scientific interest in the tunneling processes in the nitride-based structures is not limited to the optoelectronic applications. In connection with microelectronic devices, the current transport in a single barrier GaN/AlGaN/GaN structure has also been described. The nonlinear I–V characteristics was considered indicating the tunneling process through the barrier which appears to be sensitive to the applied bias due to a significant piezo-electric response of the material. This means that barrier profile and height can be affected by the external electric field and also by the mechanical stress (internal or external).

An estimation for the intersubband dipole moment <z>for e1-e2 transitions in GaN-based 2D system has been determined.

Due to a stronger electron-phonon coupling in nitride materials, the nonradiative transitions between subbands occur much faster than in arsenide-based materials. This provides quite low radiative quantum yield (typically, $10^{-5}$–$10^{-4}$) and higher expected threshold current. On the other hand, those nonradiative processes which go with absorption of the LO phonons are frozen-out in nitrides as the energy of LO phonon (~90 meV) is larger than thermal energy at RT (26 meV). As to the intra-subband relaxation, it occurs very fast supplying carrier thermalization inside the subband and effective capture of carriers into a deep quantum-confined state.

Possible increase of the lifetime of the excited (upper) state can be obtained in the quantum-dot structure with the transition energy not equal to integer number of LO phonon energies. Inter-subband relaxation time due to interaction of electrons with LO phonons was treated theoretically recently [N. Suzuki and N. Izuka, AlGaN/GaN intersubband transitions for Tb/s 1.55-$\mu$m optical switches, *SPIE*, vol. 3283 pp. 614–621 (1998)] and the phonon-assisted relaxation time for e2-e1 transition is calculated at room temperature, and for 6-ML GaN quantum well between $Al_{0.8}Ga_{0.2}N$ barriers (transition wavelength is 1 55 $\mu$m), the calculated time constant was from 80 to 109 fs (using various theoretical models) This is much shorter than the time constant (2.3 ps) in InGaAs materials used in the quantum-cascade lasers.

A characteristic time constant was obtained of 2.44 ps at carrier density of $10^{19}$ $cm^{-3}$ in the similar quantum well. For stimulated emission applications, the intersubband time should be as large as possible. Therefore the phonon-assisted channel of the nonradiative relaxation should be reduced. For this purpose the quantum-dot scheme can be promising. Due to discrete level structure of the quantum-confined states, the non-radiative relaxation does not going by a single LO phonon emission transitions, but by the multi-phonon emission transitions thus the relaxation process becomes to be much less probable. If the increase of the inter-subband relaxation time by order of value would be possible in quantum-dot structures, the threshold condition for cascade laser will be of the same range than that in arsenide-based QCLs.

In one embodiment, the present invention provides ultrathin layers separated by bulk layer, all of the same conduction type, grown on a substrate such as sapphire (hexagonal modification of $Al_2O_3$), SiC (6H hexagonal- or 3C cubic-modifications), bulky platelets of GaN and AlN, bulk spinel, ZnO, MgO, GaAs and Si. The n-type of the conductivity can be supplied by native donors, undoped layers, or by intentional doping by Si or other suitable donor impurity, donor-doped layers.

The ultimate structure itself is a cascade of several periods of quantum-size layers (the thickness in the range 1–10 nm each) separated by more thick, bulky, layers having a typical thickness 30–100 nm. Each period contains at least two quantum barriers and three quantum potential wells. Wells are formed by the narrower-bandgap material whereas barriers are formed with a wider-bandgap material both properly chosen to be grown progressively in a proper sequence each on the other. Lattice stresses arising due to the lattice period misfit can be elastically accommodated in layers giving some modification in the electronic energy spectrum of the quantum-well material, which is not of crucial significance for the conduction band of the semiconductor nitride. The tailoring of the transport and radiation properties of the quantum-size structure can be extended to ones containing objects of a lower dimensionality than 2D. Such objects can be arranged in an arrays of quantum wires (QWr) or quantum dots (QD). Corrugated quantum well structures have been considered to show the possibility of the intermediate dimensionality objects as supplied by 2D structure with a modulated depth (width) along the ultrathin layer plane. The potential depth modulation or corrugation of the QW layer affects primarily the lower quantum-confined states of the minibands, so a narrow (or discrete) low miniband can be obtained in the corrugated QW without separation of the well fragments into QWrs or QDs objects.

Technologies for preparation of the low-dimensionality objects are of several types-1) ultra-small lithographic techniques (short-wave or electron-beam exposition, etc. 2) tilted orientation growth 3) self-organized growth (under dozed lattice misfit). Most of recent results on the laser application of QDs are associated with self-organized structures by the nano-island growth mode (MBE or MOCVD epitaxies). The QD-like structure has an advantage in the laser application as it provides the discrete energy spectrum eliminating the undesirable occupation of non-working states above the working level. This allows to reduce the carrier losses for the spontaneous emission (as well as for any other recombination and leakage processes other than operation process of the laser device). Application of such structure in ultraband unipolar lasers is not yet treated theoretically or experimentally. Very recently the preparation of the heterostructure containing GaN quantum dots was reported for interband laser application. An average size of the 1-D objects was ~10 nm in width and 1–2 nm in height with a 2D density of ~$10^{11}$ $cm^{-2}$. The structure was grown by MOCVD on 6H-SiC substrate. Stimulated emission near the wavelength of 356 nm was obtained at 20 K under intense optical pumping.

Specific features of unipolar transitions include 1) cascadability of current-pumped unipolar structures 2) it is not necessary to alternate the doping (in contrast to ones with p-n junctions); 3) the correspondence of the peak position to the scheme of electronic levels and corresponding tunability by external bias, 4) proper linear polarization when observed in the edge-emission geometry (also as obtained by theoretical study; 5) more flexibility of performance at wide spectral range and in wide temperature range than in conventional bipolar optoelectronic devices.

Specific advantages of the nitride-based functional nanostructures for unipolar optoelectronic applications include the following:

There is a large range of the QW depth and barrier height, and, correspondingly, wider spectral range of possible laser operation by QW design (2–12 $\mu$m) The short-wavelength limit goes from maximum well depth in combination of conductive nitride materials with insulating barriers.

The operational photon energy for nitride-based unipolar devices can be estimated as up to 2–3 eV; therefore, it includes the visible light range. Longest wavelength is limited by absorption supplied by a resonant optical phonon modes (~92 meV in GaN); however, in the range beyond 12–14 $\mu$m limited transparency windows could be found for longer-wavelength laser action and photoelectric absorption.

The structures have high operating temperature and can keep the extrinsic conductance type In wide temperature range because of very low intrinsic equilibrium carrier density up to 1000 K The high- temperature stability of the material is limited by thermal decomposition threshold which is quite high as compared with more traditional semiconductor materials like semiconductor arsenides and phosphides.

The structures have high heat conductivity. The heat conductivity of AlN and GaN is 2 and 1.3 W/cmK, respectively, whereas it is 0.19 W/cmK in ZnSe, 0.67 W/cmK in InP and 0 44 W/cmK in GaAs This provides higher output optical power of nitride-based light emitters in respect with higher possible dissipating power; therefore a CW power of 1 W and pulse power up to 100 W could be expected over whole spectral range of operation.

The structures have the property of tunability by piezo-effect and by external voltage. The inter-subband energy level difference appears to be dependent on the strain in the quantum wells, the latter could be controlled by voltage due to the reverse piezoeffect. Therefore the applied voltage can be used for enhanced tunability of the laser emission.

The structures have a lower expected non-parabolicity of the conduction band which controls the emission bandwidth for intersubband transitions This means a lower threshold for laser emission at the same wavelength as compared with narrower-bandgap materials like InGaAs.

The structures have high-speed operation is provided by test (sub-picosecond) characteristic times for inter and intra-subband transitions in nitride based quantum-wells. Short lifetime of the upper level leads usually to an increased threshold current density. However since the threshold is overcome, the device will be capable for an optical modulation frequency range above 100 GHz.

Mechanical and chemical stability of the nitride based materials of the present invention can provide advanced characteristics of the device reliability for long-time operating The wurtzite-type semiconductor nitrides are most hard solids among III-V compounds, therefore, they are not much sensitive to the surface damaging as other optoelectronic semiconductors (GaAs, InGaAs, AlGaAs etc.). AlN and GaN do not melt at temperature above 2000° C. The catastrophic optical damage (COD) is expected to be not of that type which most semiconductor laser suffer, namely, it will not associated with local melting even in the case of the thermal runaway at the facet surface. Also, it is possible to expect higher COD power level due to both non-melting and high hardness of the material.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A semiconductor structure comprising:
   at least one active layer comprising at least one group III-nitride; and
   at least two barrier layers disposed on either side of said active layer, each of said two barrier layers comprising at least one group III-nitride, wherein said semiconductor structure is unipolar, wherein each of said barrier layers includes at least two different group III elements.

2. The semiconductor structure of claim 3, wherein said active layer includes at least two different group III elements.

3. The semiconductor structure of claim 1, wherein said structure comprises a photodetector.

4. The semiconductor structure of claim 1, wherein said structure comprises an optical modulator.

5. The semiconductor structure of claim 4, wherein said active layer further comprises at least one quantum structure selected from the group consisting of: quantum wells, quantum dots and quantum wires.

6. The semiconductor structure of claim 1, wherein said structure comprises an optical switch.

7. The semiconductor structure of claim 6, wherein said active layer further comprises at least one quantum structure selected from the group consisting of:
   quantum wells, quantum dots and quantum wires.

8. The semiconductor structure of claim 1, wherein said structure comprises a unipolar emitter for non-coherent radiation.

9. The semiconductor structure of claim 8, wherein said active layer further comprises at least one quantum structure selected from the group consisting of: quantum wells, quantum dots and quantum wires.

10. The semiconductor structure of claim 1, wherein said structure comprises a unipolar laser emitting coherent radiation.

11. The semiconductor structure of claim 10, wherein said active layer further comprises at least one quantum structure selected from the group consisting of:
    quantum wells, quantum dots and quantum wires.

12. A semiconductor structure comprising:
    at least one active layer comprising: at least one group III-nitride and at least one quantum structure selected from the group consisting of: quantum dots and quantum wires; and
    at least two barrier layers disposed on either side of said active layer, each of said two barrier layers comprising at least one group III-nitride, wherein said semiconductor structure comprises a unipolar photodetector.

13. A semiconductor structure comprising:
    at least one active layer comprising at least one group III-nitride; and
    at least two barrier layers disposed on either side of said active layer, each of said two barrier layers comprising at least one group III-nitride, wherein said semiconductor structure comprises a unipolar photoreceiver having quantum dots as optical absorbers.

14. semiconductor structure comprising:
    a first layer comprising a substrate;
    a second layer disposed on said first layer, said second layer comprising a nitride buffer;
    a third layer disposed on said second layer, said third layer comprising a ground layer;
    a fourth layer disposed on said third layer, said fourth layer comprising a nitride active region;
    a fifth layer disposed on said fourth layer, said fourth layer comprising a bulk nitride layer;
    a first electrode disposed on said fifth layer; and
    a second electrode disposed on a region of said third layer which is not covered by said fourth layer, wherein said semiconductor structure is unipolar.

15. The semiconductor structure of claim 14, wherein said third layer comprises at least one group III-nitride, said fourth layer comprises at least one group III nitride, and said fifth layer comprises at least one group III nitride.

16. The semiconductor structure of claim 14, wherein said first layer comprises a non-conductive material.

17. The semiconductor structure of claim 16, wherein said first layer comprises a material selected from the group consisting of sapphire, spinel and zinc oxide.

18. A semiconductor structure comprising:
    a first layer comprising a substrate;
    a second layer disposed on said first layer, said second layer comprising a nitride buffer;
    a third layer disposed on said second layer, said third layer comprising a ground layer;

a fourth layer disposed on said third layer, said fourth layer comprising a nitride active region;

a fifth layer disposed on said fourth layer, said fourth layer comprising a bulk nitride layer;

a first electrode disposed on said fifth layer; and a second electrode disposed on said first layer, wherein said semiconductor structure is unipolar.

19. The semiconductor structure of claim 18, wherein said third layer comprises at least one group III-nitride, said fourth layer comprises at least one group III nitride, and said fifth layer comprises at least one group III nitride.

20. The semiconductor structure of claim 18, wherein said first layer comprises a conductive material.

21. The semiconductor structure of claim 20, wherein said first layer comprises a material selected from the group consisting of: silicon silicon oxide, and gallium arsenide.

* * * * *